(12) United States Patent
Miller et al.

(10) Patent No.: US 8,059,404 B2
(45) Date of Patent: Nov. 15, 2011

(54) POWER INVERTERS

(75) Inventors: David H. Miller, Redondo Beach, CA (US); Mark D. Korich, Chino Hills, CA (US); Gregory S. Smith, Woodland Hills, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 604 days.

(21) Appl. No.: 12/248,197

(22) Filed: Oct. 9, 2008

(65) Prior Publication Data

US 2011/0170259 A1 Jul. 14, 2011

(51) Int. Cl.
*H05K 7/20* (2006.01)

(52) U.S. Cl. ........ 361/699; 361/689; 361/707; 361/721; 165/80.4; 165/104.33; 174/547; 174/548

(58) Field of Classification Search ............... 361/689, 361/699, 707, 721; 165/80.4, 104.33; 174/547, 174/548

See application file for complete search history.

(56) References Cited

U.S. PATENT DOCUMENTS

| | | | | |
|---|---|---|---|---|
| 5,305,184 | A * | 4/1994 | Andresen et al. | 361/699 |
| 5,731,954 | A * | 3/1998 | Cheon | 361/699 |
| 5,914,860 | A * | 6/1999 | Janko | 361/710 |
| 5,966,291 | A * | 10/1999 | Baumel et al. | 361/707 |
| 6,234,240 | B1 * | 5/2001 | Cheon | 165/80.3 |
| 6,313,990 | B1 * | 11/2001 | Cheon | 361/699 |
| 6,326,761 | B1 * | 12/2001 | Tareilus | 318/722 |
| 6,414,867 | B2 * | 7/2002 | Suzuki et al. | 363/141 |
| 6,972,957 | B2 * | 12/2005 | Beihoff et al. | 361/698 |
| 7,463,485 | B1 * | 12/2008 | Nishimura | 361/699 |
| 7,710,723 | B2 * | 5/2010 | Korich et al. | 361/699 |
| 2004/0008483 | A1 * | 1/2004 | Cheon | 361/687 |
| 2007/0165376 | A1 * | 7/2007 | Bones et al. | 361/688 |
| 2008/0117602 | A1 * | 5/2008 | Korich et al. | 361/715 |
| 2009/0021971 | A1 * | 1/2009 | Korich et al. | 363/141 |

FOREIGN PATENT DOCUMENTS

JP 57159050 A * 10/1982

* cited by examiner

*Primary Examiner* — Anatoly Vortman
(74) *Attorney, Agent, or Firm* — Ingrassia Fisher & Lorenz P.C.

(57) ABSTRACT

Power inverters include a frame and a power module. The frame has a sidewall including an opening and defining a fluid passageway. The power module is coupled to the frame over the opening and includes a substrate, die, and an encasement. The substrate includes a first side, a second side, a center, an outer periphery, and an outer edge, and the first side of the substrate comprises a first outer layer including a metal material. The die are positioned in the substrate center and are coupled to the substrate first side. The encasement is molded over the outer periphery on the substrate first side, the substrate second side, and the substrate outer edge and around the die. The encasement, coupled to the substrate, forms a seal with the metal material. The second side of the substrate is positioned to directly contact a fluid flowing through the fluid passageway.

20 Claims, 3 Drawing Sheets

POWER INVERTERS

STATEMENT REGARDING FEDERALLY SPONSORED RESEARCH OR DEVELOPMENT

This invention was made with Government support under DE-FC26-07NT43123 awarded by the United States Department of Energy. The Government has certain rights in this invention.

TECHNICAL FIELD

The present invention generally relates to vehicles, and more particularly relates to power inverters for use in vehicles.

BACKGROUND OF THE INVENTION

Vehicles can utilize electric fraction motors to drive wheels. In such case, a vehicle may include a three-phase alternating current (AC) motor coupled to a power inverter. The power inverter converts direct current (DC) from a power source to alternating current that can be used by the AC motor. Typically, the power inverter includes components, such as insulated gate bipolar transistors (IGBTs) and a direct bonded copper (DBC) substrate. The IGBTs act as switches used in converting the power from DC to AC and are mounted on the DBC substrate. The DBC substrate includes integrated bus bars that may be combined with a circuit card and a signal connector to provide a power electronics package for the vehicle.

As the vehicle starts, changes cruising speeds, accelerates and/or brakes, power demands of the electric traction motor driving the vehicle may fluctuate over a relatively wide range (e.g., in a range of from about 5 kW and about 120 kW). These power demand fluctuations may cause temperature changes in the power inverters during operation. Over time, the operability of the power inverter may degrade due to the temperature changes. Specifically, because IGBTs and DBCs may be made of different materials, they may expand and/or contract at different rates and thus, may shift positions relative to each other.

To limit the expansions and contractions of the power inverter components to a selected range, the temperature changes within the power inverter may be controlled. For example, the power inverter may include a cooling system that provides fluids that are circulated through heat sinks associated with the DBC substrate. In other instances, air may be directed over the power electronics package to absorb and remove heat from the DBC.

Though the aforementioned configurations have been generally sufficient for cooling the power inverter components, they may be improved. For instance, the aforementioned configurations may be relatively heavy and may not be suitable for inclusion into vehicles having weight restrictions. In other cases, the aforementioned configurations may have a relatively large footprint and may not be useful for inclusion into small vehicles. In still other cases, the heat sink may not remove heat from the DBC substrate as efficiently as desired.

Accordingly, it is desirable to have a power inverter that has a cooling system that is more lightweight and/or smaller in size than conventional inverters. In addition, it is desirable for the power inverter to be relatively simple and inexpensive to manufacture. Moreover, it is desirable for the cooling system to be suitable for inclusion into a variety of different space configurations within different types of power inverters. Furthermore, other desirable features and characteristics of the present invention will become apparent from the subsequent detailed description and the appended claims, taken in conjunction with the accompanying drawings and the foregoing technical field and background.

SUMMARY OF THE INVENTION

Power inverters are provided. In an embodiment, by way of example only, the power inverter includes a frame and a first power module. The frame has a first sidewall including a first opening. The first sidewall defines at least a portion of a fluid passageway. The first power module is coupled to the frame over the first opening and includes a substrate, a plurality of die, and an encasement. The substrate includes a first side, a second side, a center section, an outer peripheral section, and an outer edge, and the first side of the substrate comprises a first outer layer including a first metal material. The plurality of die is positioned in the center section of the substrate and is coupled to the first side of the substrate. The encasement is molded over the outer peripheral section of the substrate on the first side of the substrate, the second side of the substrate, and the outer edge of the substrate and around the plurality of die. The encasement is also coupled to the substrate to form a seal with the first metal material. The second side of the substrate is positioned to directly contact a fluid flowing through the fluid passageway.

In another embodiment, by way of example only, the power inverter includes a frame and a first power module. The frame has a first sidewall, a second sidewall, a first end wall, and a second end wall, the first sidewall and the second sidewall extends between the first end wall and the second end wall to define a portion of a fluid passageway, the first sidewall includes a first opening, the second sidewall includes a second opening, and the first opening and the second opening are in flow communication with the fluid passageway. The first power module is coupled to the frame over the first opening and includes a substrate, a plurality of die, and an encasement. The substrate has a first side, a second side, a center section, an outer peripheral section, and an outer edge, the first side of the substrate comprising a first outer layer including a first metal material. The plurality of die is positioned in the center section of the substrate and is coupled to the first side of the substrate. The encasement is molded over the outer peripheral section of the substrate on the first side of the substrate, the second side of the substrate, and the outer edge of the substrate and around the plurality of die, and is coupled to the substrate to form a seal with the first metal material. The second side of the substrate is positioned to directly contact a fluid flowing through the fluid passageway.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
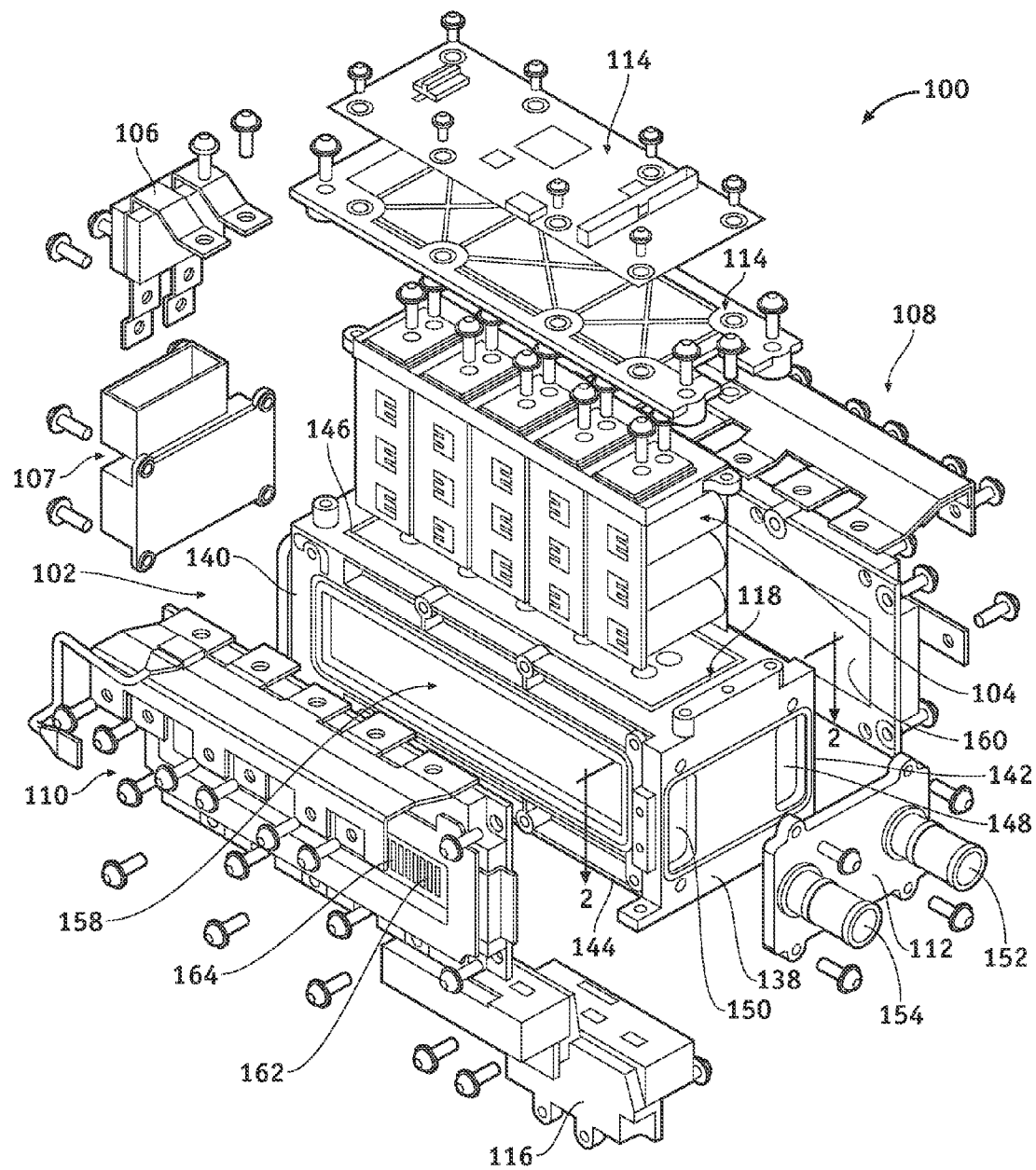
FIG. 1 is an exploded isometric view of a power inverter, according to an embodiment.

FIG. 1 is an exploded isometric view of a power inverter 100, according to an embodiment. The power inverter 100 is adapted to convert direct current power into alternating current power and may be used in a vehicle, such as an automobile, or any other landcraft, aircraft, watercraft, spacecraft, and the like. In an embodiment in which the inverter 100 is employed in an automobile, the automobile may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). Although not shown, the automobile may also incorporate any one of, or combination of, a number of different types of engines that provide the direct current power to the inverter 100, such as, for example, a gasoline or diesel fueled combustion engine, a "flex fuel vehicle" (FFV) engine (i.e., using a mixture of gasoline and alcohol), a gaseous compound (e.g., hydrogen and natural gas) fueled engine, a combustion/electric motor hybrid engine (i.e., a "hybrid vehicle"), and/or an electric motor.

According to an embodiment, the power inverter 100 is configured to receive a fluid, such as a coolant, from a fluid source (not shown) and to circulate the fluid through cavities formed in the power inverter 100. In this way, components that are included as part of the power inverter 100 may be cooled by the fluid. The power inverter 100 includes a frame 102 to which the various components are mounted. In an embodiment, the components include a capacitor assembly 104, an input filter 106, first and second power module assemblies 108, 110, a connector plate 112, a control assembly 114, and current sensors 116. In other embodiments, the power inverter 100 may include additional components or fewer components than listed previously.

According to an embodiment, the frame 102 is adapted to provide structure to the inverter 100. For example, the frame 102 may have a substantially three-dimensionally rectangular shape and may include two end walls 138, 140, two sidewalls 142, 144, and an interior box 146. The two sidewalls 142, 144 extend between the two end walls 138, 140 to define a cavity 118 within which the interior box 146 may be disposed. According to an embodiment, the sidewalls 142, 144 define a length of the frame 102, wherein the length is in a range of from about 8 cm to about 45 cm, and the end walls 138, 140 define a width of the frame 102, wherein the width is in a range of from about 3 cm to about 20 cm. The walls 138, 140, 142, 144 may also provide a height of the frame 102, wherein the height is in a range of from about 6 cm to about 20 cm. In other embodiments, the dimensions of the walls 138, 140, 142, 144 may be greater or less, depending on a limitation of space that may be imposed on the power inverter 100. Additionally, the frame 102 may not be rectangular in other embodiments, and may be, for example, spherical, cylindrical or another three-dimensional shape.

The cavity 118 formed by the walls 138, 140, 142, 144 of the frame 102 may have dimensions that depend on the thicknesses of the walls 138, 140, 142, 144. For example, the cavity 118 may have a length in a range of from about 7 cm to about 44 cm, a width in a range of from about 2 cm to about 19 cm, and a height in a range of from about 5 cm to about 19 cm. In other embodiments, the dimensions of the cavity 118 may be greater or less. In still other embodiments, the dimensions may extend a majority of the length and width, as well as substantially the entire height of the frame 102.

Figure 2:
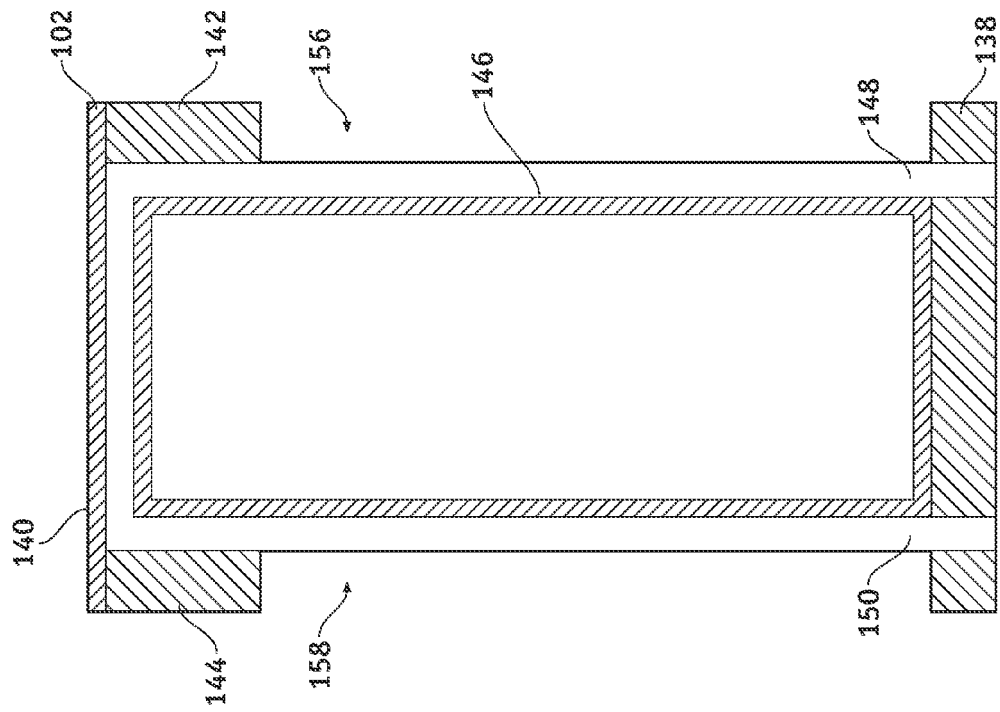
FIG. 2 is a cross-sectional view of a portion of the power inverter of FIG. 1 taken along line 2-2, according to an embodiment.

With additional reference to FIG. 2, a cross-sectional view is provided of a portion of the power inverter 100 of FIG. 1 taken along line 2-2. As shown in FIGS. 1 and 2, the interior box 146 has walls that are spaced apart from the end walls 138, 140 and sidewalls 142, 144 of the frame 102 to form a gap that defines a passageway 120. In an embodiment, the gap between the frame walls 138, 140, 142, 144 and the interior box 146 may have a substantially uniform distance. In another embodiment, the gap may have a varying distance. The passageway 120 may be configured to define a volume of space in a range of approximately 0.25 liters (L) to about 3 L. In other embodiments, the volume may be greater or smaller.

In any case, the passageway 120 communicates with the various openings in the frame 102 to receive fluid and to allow the fluid to flow through the passageway 120 to directly contact the power module assemblies 108, 110 for cooling. According to an embodiment, one of the end walls 138 includes a fluid inlet 148 and a fluid outlet 150. The fluid inlet 148 and the fluid outlet 150 may be formed adjacent to each other and may be suitably shaped and sized to correspond with inlet and outlet ports 152, 154 included on the connector plate 112. For example, the fluid inlet 148 and fluid outlet 150 may be rectangular and may have a widest diameter in a range of from about 1 cm to about 2 cm. In other example embodiments, the fluid inlet 148 and outlet 150 may be circular, ovular, triangular or another shape, and may have a widest measurement that is greater than or less than the aforementioned range.

To provide direct cooling to the first and second power module assemblies 108, 110, openings 156, 158 are included in the sidewalls 142, 144. The sidewall openings 156, 158 may be rectangular and may have a widest diameter in a range of from about 4 cm to about 12 cm. In other example embodiments, the sidewall openings 156, 158 may be circular, ovular, triangular, or another shape, and may have a widest measurement that is greater than or less than the aforementioned range.

Returning to FIG. 1, the capacitor assembly 104 and the input filter 106 are adapted to be at least partially disposed in the frame 102. According to an embodiment, the capacitor assembly 104 is substantially rectangular in shape with dimensions similar to those of the interior box 146 of the frame 102. Although not illustrated, the capacitor assembly 104 includes a set of conductor plates, or sets of conductive plates, spaced apart from each other and wound into coils to form a capacitor, or multiple capacitors, as is commonly understood. The input filter 106 is connected to an end of the capacitor assembly 104, and in one embodiment, includes a Faraday coil that is electrically coupled to the capacitor(s) within the capacitor assembly 104. In accordance with an embodiment, the input filter 106 may be an electromagnetic interference (EMI) filter, or any other type of suitable filter for use in conjunction with a capacitor assembly 104. In accordance with an embodiment, the input filter 106 may be disposed in a housing assembly 107, which may be received in the cavity 118. Although not shown, an epoxy or resin material may be placed in the cavity 118 with the capacitor assembly 104 and the input filter 106 (or housing assembly 107) to encase the assembly 104 and filter 106 in the interior box 146, as well as to secure the assembly 104 and the filter 106 to the frame 102.

As noted above, the power module assemblies 108, 110 are coupled to the sidewalls 142, 144 of the frame 102 over the openings 156, 158, respectively. Each power module assembly 108, 110 includes a power module substrate 160, 162 and a power module device 164 (only one device 164 corresponding to substrate 162 is shown) attached to the substrate 160, 162. In other embodiments, more power module devices may be included. For example, in other embodiments, three power module devices may be included. In still other embodiments, more or fewer may be employed. In an embodiment, the power module substrates 160, 162 are aligned with the openings 156, 158 and secured to the corresponding sidewalls 142, 144 of the frame 102 to thereby cover the openings 156, 158. The power module substrate 160 may be attached to the walls 142, 144 via any one of numerous manners suitable for forming a leak-tight seal therewith. For example, a gasket or o-ring seal. The connector plate 112 is secured to the end wall 142 of the frame 102 opposite the input filter 106 such that the inlet port 152 and the outlet port 154 are in fluid communication with the inlet opening 148 and the outlet opening 150, respectively, shown in FIG. 1.

The control assembly 114 is adapted to measure and detect currents (via the current sensors 116) that may flow across the power module device 164 and to provide command signals to the power module device 164 when the measurements are greater than or less than a desired value. In an embodiment, the control assembly 114 is mounted to the frame 102 over the capacitor assembly 104 and includes a microprocessor, as is commonly understood, for controlling the operation of the inverter 100 as described below. Although not specifically illustrated, the current sensors 116 are in operable communication with (e.g., electrically coupled to) the control assembly 114.

Figure 3:
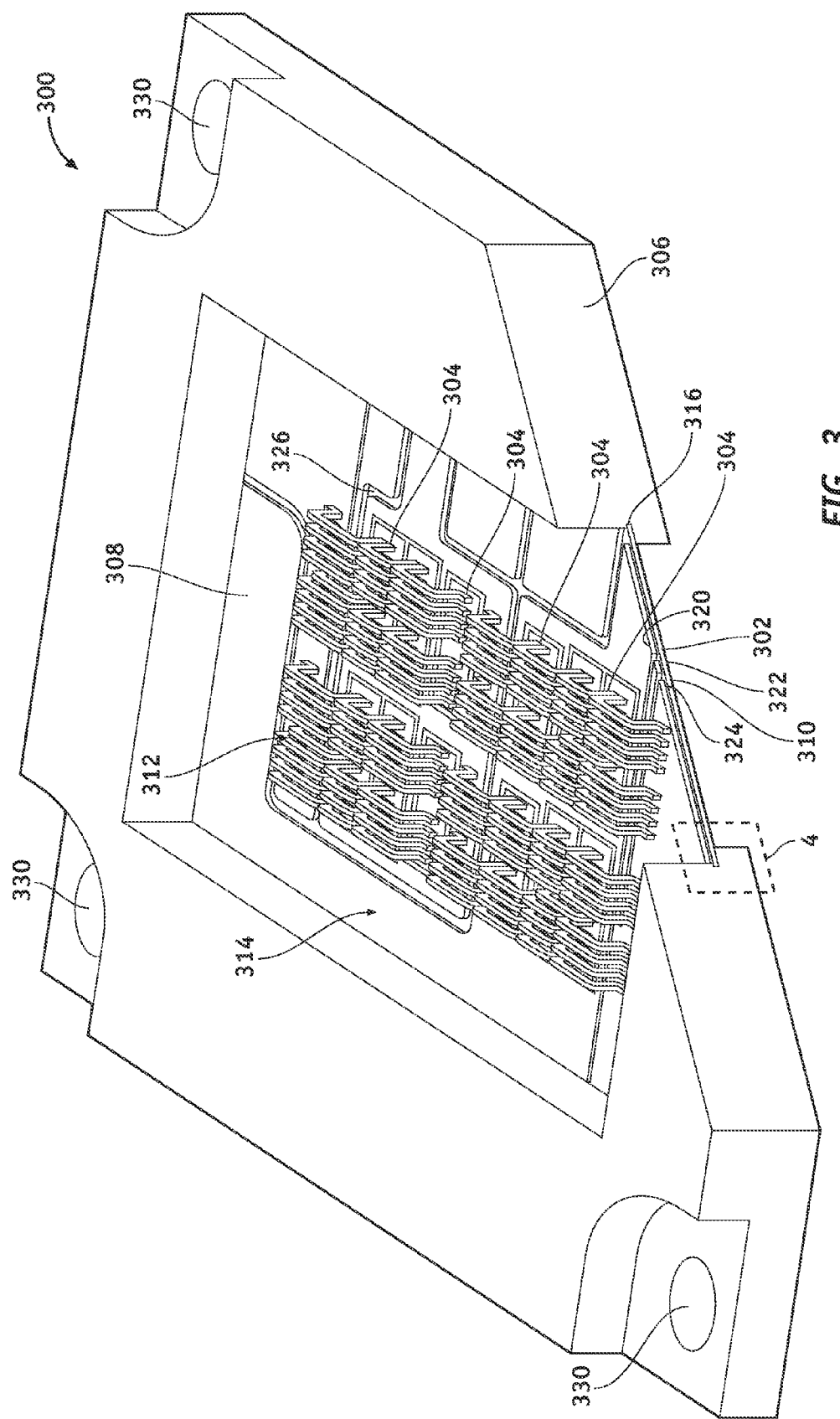
FIG. 3 is a cutaway view of a power module, according to an embodiment.

To ensure that the power module device 164 remains relatively cool during operation, the power module assemblies 108, 110 may be constructed in a manner similar to that embodied in FIG. 3. FIG. 3 is a cutaway view of a power module assembly 300, according to an embodiment. The power module assembly 300 includes a substrate 302, a plurality of die 304, and an encasement 306. The substrate 302 is adapted to electrically connect at least two of the die 304 to each other and/or to the control assembly 114 (FIG. 1) and has a first side 308, a second side 310, a center section 312, an outer peripheral section 314, and an outer edge 316. According to an embodiment, the plurality of die 304 make up the power module device 164 (FIG. 1) and are positioned in the center section 312 of the substrate 302 on the first side 308 of the substrate 302. The die 304 may be coupled to or formed as part of the substrate 302 and may include switches, such as insulated gate bipolar transistors, MOSFETs, and the like. In an embodiment, the die 304 are electrically coupled via wires 318 and/or conductive traces.

Figure 4:
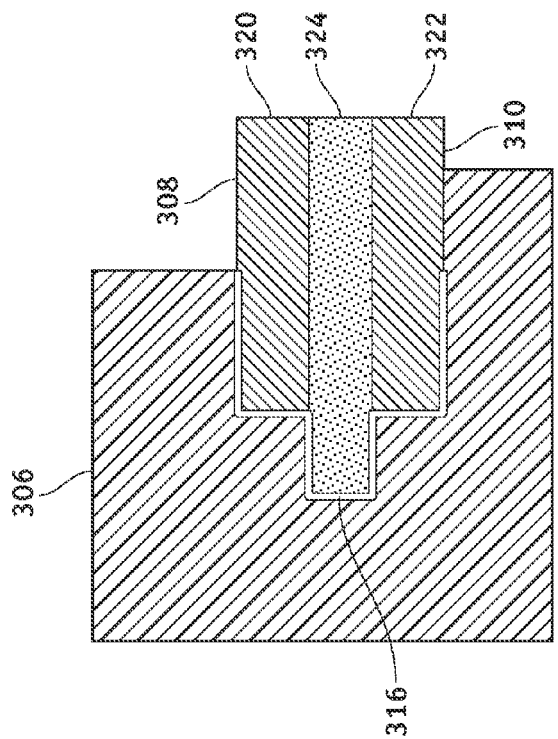
FIG. 4 is a close-up, cross-sectional view of a portion of the power module illustrated in FIG. 3, indicated by dotted box 4, according to an embodiment.

To provide electrical communication with the control assembly 114 (FIG. 1), the substrate 302 may be configured similarly or identically to a direct bond copper substrate, in an embodiment. For example, the substrate 302 may include a first outer layer 320 and a second outer layer 322 interposed by an inner layer 324. FIG. 4 is a close-up, cross-sectional view of a portion of the power module device 300 illustrated in FIG. 3 indicated by dotted box 4, according to an embodiment. With reference to FIGS. 3 and 4, the first outer layer 320 and the second outer layer 322 comprise metallic materials suitable for providing electrical connections and contacts. For example, the metal materials may include copper and the like. In an embodiment, both outer layers 320, 322 comprise the same metallic materials. In another embodiment, the outer layers 320, 322 comprise different metallic materials.

According to an embodiment, each outer layer 320, 322 may have a thickness in a range of about 200 microns to 400 microns. In other embodiment, the thicknesses may be greater or less. In some embodiments, the layers 320, 322 may have substantially equal thicknesses, while in other embodiments the thicknesses may not be equal.

The first outer layer 320 may include trenches 326 etched into its surface. The trenches 326 may be used to define one or more sections of the substrate 300 and to conduct current from one area of the first outer layer to another area of the first outer layer. As a result, portions of a surface of the inner layer 324 may be exposed. The second outer layer 322 is adapted to contact the fluid during operation and may cover substantially an entirety of the second side 310 of the substrate 300 so that components (e.g., the die 304) on the first side 320 and the material of the inner layer 324 are not exposed to the fluid. The inner layer 324 may be made of a ceramic or other material, in various embodiments. For example, the inner layer 324 may comprise silicon, aluminum oxide, or another ceramic material conventionally used in the construction of substrates.

The encasement 306 and the substrate 300 form a seal so that, during operation, the fluid may directly contact the second side 310 of the substrate 300 without contacting the first side 308. In this regard, the encasement 306 is molded over the outer peripheral section 314 of the substrate 300, and the second side 310 may be positioned to contact the fluid from the fluid passageway 120 (FIG. 1). In an embodiment, the encasement 306 extends from the first side 308 of the substrate 300 and around the outer edge 316 to the second side 310 of the substrate 300. In a preferred embodiment, at least a portion of the encasement 306 is coupled to the substrate 300 to form the seal with the materials making up the first side 308, the outer edge 316, and the second side 310 of the substrate 300. The seal may be a hermetic seal so that the fluid is substantially prevented from penetrating a gap between the encasement 306 and the substrate 300.

In an embodiment in which the first side 308, the outer edge 316, and the second side 310 include metal material, the encasement 306 may include a plastic material or a liquid crystal polymer material. The plastic or liquid crystal polymer material may have coefficients of thermal expansion that are substantially similar to the coefficient of thermal expansion of the metal materials of the first and/or second outer layers 320, 322 to minimize expansion and contraction of the components of the power module device 300. Examples of suitable plastic and/or liquid crystal polymer materials include Quantech™ material from Quantum Leap Packaging, Inc. of Wilmington, Mass. To form the encasement 306 on the substrate 300, the substrate 300 may be placed in a suitably shaped mold and the plastic or liquid crystal polymer material may be injection molded into the mold and onto the substrate 300.

Because the encasement 306 surrounds an entirety of the substrate 300, it has dimensions that are larger than the substrate 300. For example, the substrate 300 may have a length in a range of about 4 cm to about 9 cm, a width in a range of about 3 cm to about 7 cm, and a thickness in a range of about 0.1 mm to about 0.2 mm, while the encasement 306 may have a length in a range of about 5 cm to about 12 cm, a width in a range of about 4 cm to about 9 cm, and a thickness in a range of about 1 cm to about 3 cm. In other embodiments, the dimensions of the encasement 306 and/or the substrate 300 may be larger or smaller.

Although a portion of the encasement 306 on the first side 308 of the substrate 300 is illustrated as being thicker than a portion of the encasement 306 on the second side 310 of the substrate 300, other embodiments may include portions of substantially equal thickness. Alternatively, the portion of the encasement 306 on the second side 310 of the substrate 300 may be thicker than the portion of the encasement 306 on the first side 308 of the substrate 300. Additionally, although the portion of the encasement 306 on the second side 310 of the substrate 300 is illustrated as extending further inward toward the center section 312 of the substrate 300 than the portion of the encasement 306 on the first side 308 of the substrate 300, this may not be the case in other embodiments. For instance, both portions of the encasement 306 may extend a substantially equal distance toward the center section 312, or the portion of the encasement 306 on the first side 308 of the substrate 300 may extend further toward the center section 312 than the portion of the encasement 306 on the second side 310 of the substrate 300.

In accordance with an embodiment, the encasement 306 may be employed to couple the power module assembly to the frame 102 (FIG. 1), in an embodiment. In an example, the encasement 306 may include openings 330 on its outer periphery for receiving fasteners, such as screws or bolts. According to an embodiment, the openings 330 may be formed on a radially-projecting flange, or may be formed at corners of the encasement 306 (as depicted in FIG. 3).

During operation, direct current (DC) power is provided to the inverter 100, which converts the DC power into alternating current (AC) power. To cool the inverter 100, fluid is provided to the inverter 100 through the inlet port 152 on the connector plate 112 and enters the fluid passageway 120 through the inlet opening 148. In a first portion of the fluid passageway 120 (e.g., adjacent to the first power module assembly 108), heat generated by the first power module assembly 108 is conducted through the substrate (e.g., substrate 300) from a first side (e.g., first side 308) to a second side (e.g., second side 310) and is transferred to, or absorbed by, the fluid. The frame first sidewall opening 156 provides direct contact between the substrate 300 and the fluid. Likewise, in a second portion of the fluid passageway 120 (i.e., adjacent to the second power module assembly 110), heat generated by the second power module assembly 110 and conducted through its substrate from the substrate first side to the substrate second side is transferred to the fluid. The frame second sidewall opening 158 provides direct contact between the substrate 300 and the fluid. The fluid then exits the fluid passageway 120 through the outlet opening 150 and passes through the outlet port 154 on the connector plate 112. The fluid then returns to the fluid source where it is cooled before returning to the inverter 100.

By including an encasement on the power module assemblies 108, 110, heat may pass directly from assemblies 108, 110 via the substrate 300 to the fluid. Consequently, the above-described configuration eliminates the need for a heat sink and/or o-ring or gasket between the substrate and the fluid passageway, which results in fewer components being included in the inverter 100. Additionally, the above-described inverter may have a reduced overall size and weight, as compared to conventionally-designed inverters. Moreover, because the encasement may be injection-molded around the substrate, it may be formed into a variety of shapes to allow a power module assembly to conform to various available space configurations having a variety of shapes and sizes.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A power inverter comprising:
   a frame having a first sidewall including a first opening, the first sidewall defining at least a portion of a fluid passageway; and
   a first power module coupled to the frame over the first opening, the first power module including:
   a substrate including a first side, a second side, a center section, an outer peripheral section, and an outer edge, the first side of the substrate comprising a first outer layer including a first metal material,
   a plurality of die positioned in the center section of the substrate and coupled to the first side of the substrate, and
   an encasement molded over the outer peripheral section of the substrate on the first side of the substrate, the second side of the substrate, and the outer edge of the substrate and around the plurality of die, the encasement coupled to the substrate to form a seal with the first metal material,
   wherein the second side of the substrate is positioned to directly contact a fluid flowing through the fluid passageway.

2. The power inverter of claim 1, wherein:
   the first metal material comprises copper.

3. The power inverter of claim 1, wherein:
   the second side comprises a second outer layer including a second metal material;
   the substrate further comprises an inner layer disposed between the first outer layer and the second outer layer and including a ceramic material; and
   the encasement forms a seal with the second metal material.

4. The power inverter of claim 3, wherein:
   the first and the second metal materials comprise copper.

5. The power inverter of claim 3, wherein:
   the inner layer comprises silicon.

6. The power inverter of claim 1, wherein:
   the seal is a hermetic seal.

7. The power inverter of claim 1, wherein:
   the encasement comprises a plastic material.

8. The power inverter of claim 1, wherein:
   the encasement comprises a liquid crystal polymer.

9. The power inverter of claim 1, wherein:
   the frame further includes a second sidewall, a first end wall, and a second end wall, the first sidewall and the second sidewall extend between the first end wall and the second end wall to further define the fluid passageway, the first end wall includes an inlet opening and an adjacent outlet opening, and the inlet opening and the outlet opening are in flow communication with the fluid passageway.

10. The power inverter of claim 1, wherein:
    the frame further includes a second sidewall, a first end wall, and a second end wall, the first sidewall and the second sidewall extend between the first end wall and the second end wall to further define the fluid passageway, and the second sidewall includes a second opening in flow communication with the fluid passageway.

11. The power inverter of claim 10, further comprising:
a second power module coupled to the second sidewall and disposed over the second opening of the second sidewall.

12. The power inverter of claim 1, further comprising:
a capacitor assembly disposed in the frame.

13. The power inverter of claim 10, wherein:
the frame further includes an interior box disposed therein and spaced apart from the first sidewall to define another portion of the fluid passageway.

14. A power inverter comprising:
a frame having a first sidewall, a second sidewall, a first end wall, and a second end wall, the first sidewall and the second sidewall extending between the first end wall and the second end wall to define a portion of a fluid passageway, the first sidewall including a first opening, the second sidewall including a second opening, and the first opening and the second opening are in flow communication with the fluid passageway; and
a first power module coupled to the frame over the first opening, the first power module including:
a substrate having a first side, a second side, a center section, an outer peripheral section, and an outer edge, the first side of the substrate comprising a first outer layer including a first metal material,
a plurality of die positioned in the center section of the substrate and coupled to the first side of the substrate, and
an encasement molded over the outer peripheral section of the substrate on the first side of the substrate, the second side of the substrate, and the outer edge of the substrate and around the plurality of die, the encasement coupled to the substrate to form a seal with the first metal material,
wherein the second side of the substrate is positioned to directly contact a fluid flowing through the fluid passageway.

15. The power inverter of claim 14, further comprising:
a second power module coupled to the second sidewall and disposed over the second opening of the second sidewall.

16. The power inverter of claim 14, wherein:
the second side comprises a second outer layer including a second metal material,
the substrate further comprises an inner layer disposed between the first outer layer and the second outer layer and including a ceramic material,
the encasement forms a seal with the second metal material, and
the first and the second metal materials comprise copper.

17. The power inverter of claim 16, wherein:
the inner layer comprises silicon.

18. The power inverter of claim 14, wherein:
the seal is a hermetic seal.

19. The power inverter of claim 14, wherein:
the encasement comprises a plastic material.

20. The power inverter of claim 14, wherein:
the encasement comprises a liquid crystal polymer.

* * * * *